United States Patent
Lee (10) Patent No.: US 9,459,882 B2
(45) Date of Patent: Oct. 4, 2016

(54) MONITORING CIRCUIT OF SEMICONDUCTOR DEVICE TO MONITOR A READ-PERIOD SIGNAL DURING ACTIVATION OF A BOOT-UP ENABLE SIGNAL

(71) Applicant: SK hynix Inc., Icheon-si Gyeonggi-do (KR)

(72) Inventor: Joo Hyeon Lee, Bucheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 126 days.

(21) Appl. No.: 14/509,193

(22) Filed: Oct. 8, 2014

(65) Prior Publication Data
US 2015/0377966 A1 Dec. 31, 2015

(30) Foreign Application Priority Data
Jun. 26, 2014 (KR) .......................... 10-2014-0078682

(51) Int. Cl.
| G06F 15/177 | (2006.01) |
| G06F 1/00 | (2006.01) |
| G11C 17/18 | (2006.01) |
| G06F 9/44 | (2006.01) |
| G01R 31/317 | (2006.01) |
| G06F 1/24 | (2006.01) |

(52) U.S. Cl.
CPC ....... *G06F 9/4401* (2013.01); *G01R 31/31701* (2013.01); *G06F 1/24* (2013.01)

(58) Field of Classification Search
CPC .................................................... G06F 9/4401
USPC .............................................................. 713/2
See application file for complete search history.

(56) References Cited

U.S. PATENT DOCUMENTS

| 8,322,922 | B2* | 12/2012 | Lee et al. ...................... 374/170 |
| 8,487,679 | B2* | 7/2013 | Kim et al. ..................... 327/158 |
| 8,743,644 | B2* | 6/2014 | Oh et al. ..................... 365/225.7 |
| 8,867,255 | B2* | 10/2014 | Lee et al. ........................ 365/96 |
| 9,058,864 | B2* | 6/2015 | Jung |
| 2013/0258748 | A1 | 10/2013 | Kim et al. |
| 2013/0285709 | A1 | 10/2013 | Oh et al. |
| 2014/0056084 | A1* | 2/2014 | Jeong et al. ............. 365/189.09 |
| 2015/0006926 | A1* | 1/2015 | Hong ............................ 713/320 |

\* cited by examiner

*Primary Examiner* — Suresh Suryawanshi
(74) *Attorney, Agent, or Firm* — William Park & Associates Ltd.

(57) ABSTRACT

The monitoring circuit of a semiconductor device includes: a boot-up controller configured to generate a boot-up enable signal in response to a power-up signal and a boot-up command signal; a read-period generator configured to output a read-period signal in response to a boot-up read signal; and a monitoring unit configured to output the read-period signal to an external output terminal during activation of the boot-up enable signal to allow the read-period signal to be monitored.

20 Claims, 11 Drawing Sheets

MONITORING CIRCUIT OF SEMICONDUCTOR DEVICE TO MONITOR A READ-PERIOD SIGNAL DURING ACTIVATION OF A BOOT-UP ENABLE SIGNAL

CROSS-REFERENCE TO RELATED APPLICATION

This application claims priority based upon Korean patent application No. 10-2014-0078682, filed on Jun. 26, 2014, the disclosure of which is hereby incorporated in its entirety by reference herein.

BACKGROUND

Embodiments of the invention relate to a monitoring circuit of a semiconductor device, and more particularly to a technology for easily analyzing a defect of the semiconductor device.

A semiconductor integrated circuit includes circuits of the same pattern and also includes a redundancy circuit so that although some circuits have a defect or failure according to a process variable, the semiconductor integrated circuit may be used as a normal product.

An operation in which programmed array E-fuse (ARE) data is stored in the register is referred to as a boot-up operation. A boot-up operation is initiated based on a reset signal inputted from the outside during an initialization operation.

An E-fuse basically has a form of a transistor and is programmed by applying a high electric field to a gate and rupture a gate insulation layer. While an E-fuse circuit may be realized in diverse forms, an array E-fuse (ARE) circuit having unit fuse cells formed in an array is widely used. Generally, when a semiconductor integrated circuit performs an initialization operation, which is a power-up operation, a data programmed in an ARE circuit is read and subsequently stored in a register, and the stored data is used. Thereafter, a repair operation is performed using the data stored in the register.

However, if a read period of a semiconductor memory device configured to use the ARE increases, the boot-up time unavoidably increases so that fuse-repair information may be damaged. In other words, if the boot-up operation fails due to the increasing read period or if the boot-up operation stops due to an unexpected malfunction, it is impossible for the semiconductor memory device based on ARE to monitor the failed or stopped boot-up operation at a remote site.

BRIEF SUMMARY

In accordance with an embodiment of the invention, a monitoring circuit of a semiconductor device includes a boot-up controller configured to generate a boot-up enable signal in response to a power-up signal and a boot-up command signal. The monitoring circuit may also include a read-period generator configured to output a read-period signal in response to a boot-up read signal. Further, the monitoring circuit may include a monitoring unit configured to output the read-period signal to an external output terminal during activation of the boot-up enable signal to allow the read-period signal to be monitored.

In accordance with an embodiment of the invention, a monitoring circuit of a semiconductor device includes a boot-up controller configured to generate a boot-up enable signal in response to a power-up signal and a boot-up command signal. The monitoring circuit may also include a read-period generator configured to output a read-period signal in response to a boot-up read signal and a latch enable signal. Further, the monitoring circuit may include a counter unit configured to output a counting signal by counting the number of read-period signals during an activation of the boot-up enable signal, and output a count-end signal upon completion of the counting operation. In addition, the monitoring circuit may include an array E-fuse (ARE) configured to output repair information in response to the counting signal. The monitoring circuit may also include a monitoring unit configured to output the read-period signal to an external output terminal during activation of the boot-up enable signal to allow the read-period signal to be monitored.

DETAILED DESCRIPTION

Reference will now be made in detail to various embodiments, examples of which are illustrated in the accompanying drawings. Wherever possible, the same reference numbers will be used throughout the drawings to refer to the same or like parts. In the following description, a detailed description of well-known configurations or functions may be omitted. Various embodiments of the invention are directed to providing a monitoring circuit of a semiconductor device. Embodiments of the invention may relate to a technology for monitoring the read period of a semiconductor device configured to an array E-fuse (ARE) at a remote site.

Figure 1:
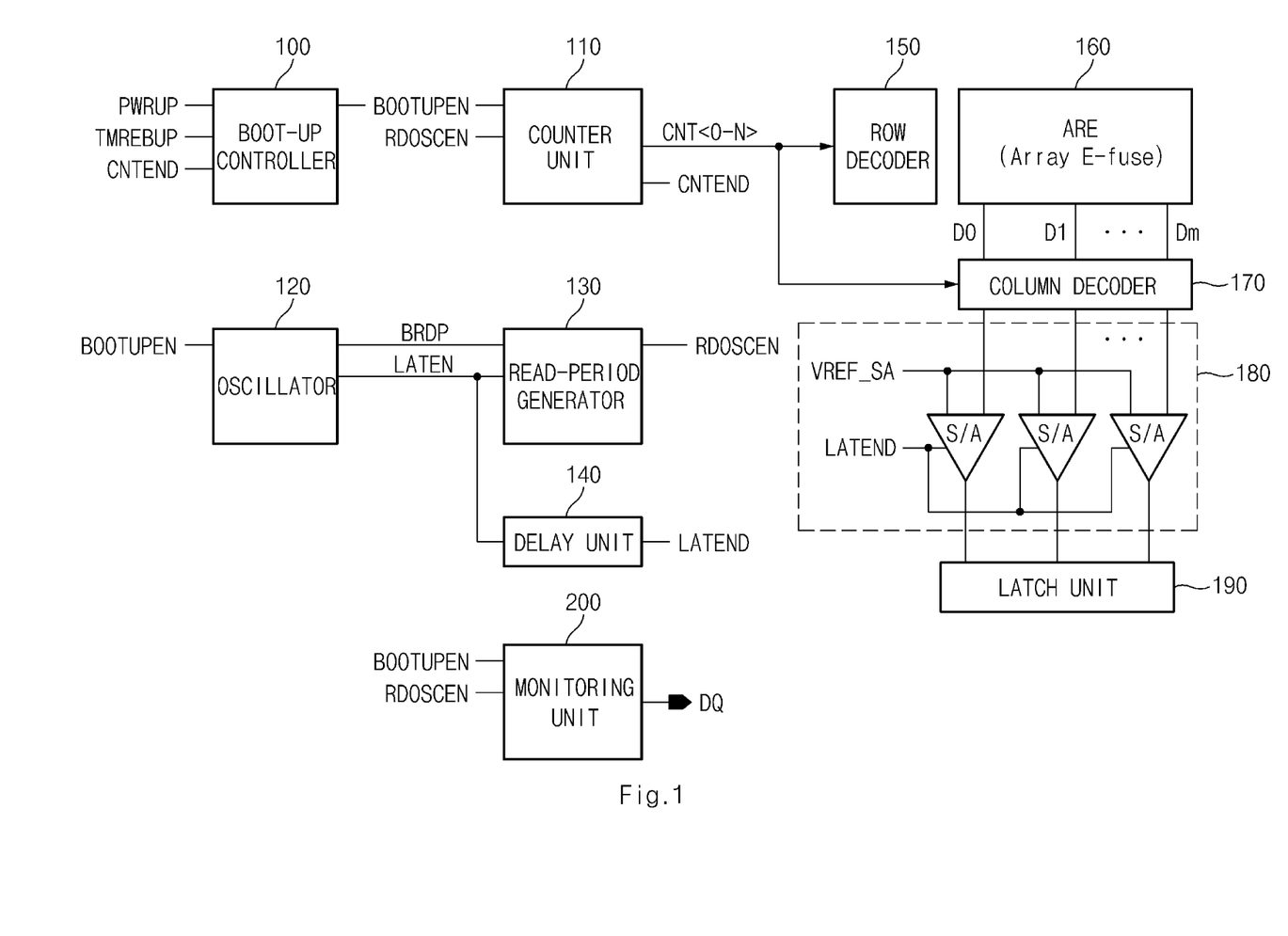
FIG. 1 is a block diagram illustrating a monitoring circuit of a semiconductor device according to an embodiment of the invention.

Referring to FIG. 1, a block diagram illustrating a monitoring circuit of a semiconductor device according to an embodiment of the invention is shown.

The monitoring circuit of the semiconductor device includes a boot-up controller 100, a counter unit 110, an oscillator 120, a read-period generator 130, a delay unit 140, a row decoder 150, an array E-fuse (ARE) 160, a column decoder 170, a sensing unit 180, and a latch unit 190.

The boot-up controller 100 generates a boot-up enable signal BOOTUPEN by combining a power-up signal PWRUP, a boot-up command signal TMREBUP, and a count-end signal CNTEND. In this case, the boot-up command signal TMREBUP may indicate a command signal to perform a reboot-up operation during a test mode. The boot-up controller 100 may activate the boot-up enable signal BOOTUPEN in response to the power-up signal PWRUP to read information of the ARE 160.

Fuse information of the ARE 160 is read during a specific period in which the boot-up enable signal BOOTUPEN is activated. After lapse of a predetermined time upon activation of the boot-up enable signal BOOTUPEN, the count-end signal CNTEND is activated so that the boot-up enable signal BOOTUPEN is deactivated. This count end signal CNTEND is a control signal to terminate the read operation.

The counter unit 110 counts the number of read-period signals RDOSCEN in response to the boot-up enable signal BOOTUPEN, and outputs the counting signals CNT<0~N>. That is, the counter unit 110 counts a predetermined number of read periods needed to read the repair information, activates the count-end signal CNTEND to a high level and outputs the high-level count-end signal CNTEND. The counter unit 110 performs (N+1) counting operations, activates the count-end signal CNTEND, and outputs the activated count-end signal CNTEND.

If the boot-up enable signal BOOTUPEN is activated, the counter unit 110 outputs the counting signals CNT<0~N> to control the read operation of the ARE 160 to a row decoder 150 and a column decoder 170.

In this case, the counting signals CNT<0~N> may be a control signal to control the row decoder 150 configured to select a row line of the ARE 160, or may be a control signal to control the column decoder 170 configured to select a column line of the ARE 160.

The oscillator 120 generates an oscillation signal in response to the boot-up enable signal BOOTUPEN, and outputs a boot-up read signal BRDP and a latch enable signal LATEN. In this case, the boot-up read signal BRDP may indicate a start point of the read operation. The latch enable signal LATEN may be a control signal to sense cell information of the ARE 160.

The read-period generator 130 may output the read-period signal RDOSCEN in response to the boot-up read signal BRDP and the latch enable signal LATEN. In addition, the delay unit 140 delays the latch enable signal LATEN, and outputs a latch control signal LATEND.

The row decoder 150 may select the corresponding word line of the ARE 160 in response to the counting signals CNT<0~N>. The column decoder 170 may select the corresponding bit line of the ARE 160 in response to the counting signals CNT<0~N>. If the column decoder 170 operates, data (D0~Dm) read from the ARE 160 is applied to the sensing unit 180.

The ARE 160 performs the read operation in response to a drive signal received through the row decoder 150 and the column decoder 170, and sequentially outputs cell information. The ARE 160 includes a plurality of fuse-sets composed of row and column lines, resulting in creation of a matrix structure.

The ARE 160 stores address information of a defective cell due to the rupture operation, and outputs the stored information to the sensing unit 180 upon receiving the drive signal from the column decoder 170. In this instance, each fuse-set may be composed of an E-fuse that is configured to perform information programming by melting the fuse due to the occurrence of an overcurrent.

The sensing unit 180 may include a plurality of bit-line sense-amplifiers (S/A). Each bit-line sense-amplifier S/A may sense and amplify data (D0~Dm) in response to a reference voltage VREF_SA and a latch control signal LATEND. If the sensed voltage is higher than the reference voltage VREF_SA, the bit-line sense-amplifier S/A outputs data of 1 to indicate that the fuse is ruptured. On the other hand, when the sensed voltage is lower than the reference voltage VREF_SA, the bit-line sense-amplifier S/A outputs data of 0 to indicate that the fuse is not ruptured. The latch unit 190 may be latched to an output-data fuse unit of the sensing unit 180.

The ARE 160 is configured in the form of an array, so that a predetermined time is consumed to retrieve data stored in the ARE 160. Since it is impossible to immediately retrieve data, it is also impossible to perform the repair operation using the data stored in the ARE 160.

Therefore, repair information and configuration information stored in the ARE 160 are transmitted to the latch unit 190 and stored therein. Data stored in the latch unit 190 may be used in the repair operation of memory banks.

In this situation, the operation that the repair information stored in the ARE 160 is transferred to the latch unit 190 is referred to as a boot-up operation. Upon completion of the boot-up operation, the memory device repairs a defective cell and initiates a normal operation after completion of a variety of configuration operations.

In addition, upon receiving the boot-up enable signal BOOTUPEN, the monitoring unit 200 monitors the read-period signal RDOSCEN during the boot-up period. The monitoring unit 200 also outputs the monitored result to an output terminal DQ. If the read period of the semiconductor device increases, the boot-up time also increases, so that the fuse repair information may be damaged.

In accordance with an embodiment of the invention, if the boot-up enable signal is enabled upon activation of the power-up signal PWRUP, the read oscillation signal is output to the output terminal DQ. As a result, a state of the read oscillation signal can be identified at a remote site. Accordingly, the monitoring circuit according to the embodiments determines whether the boot-up operation stops due to the occurrence of an abnormal phenomenon or determines the presence or absence of an incomplete boot-up operation. The monitoring circuit also can screen out-of-specification products caused by skew variation.

Figure 2:
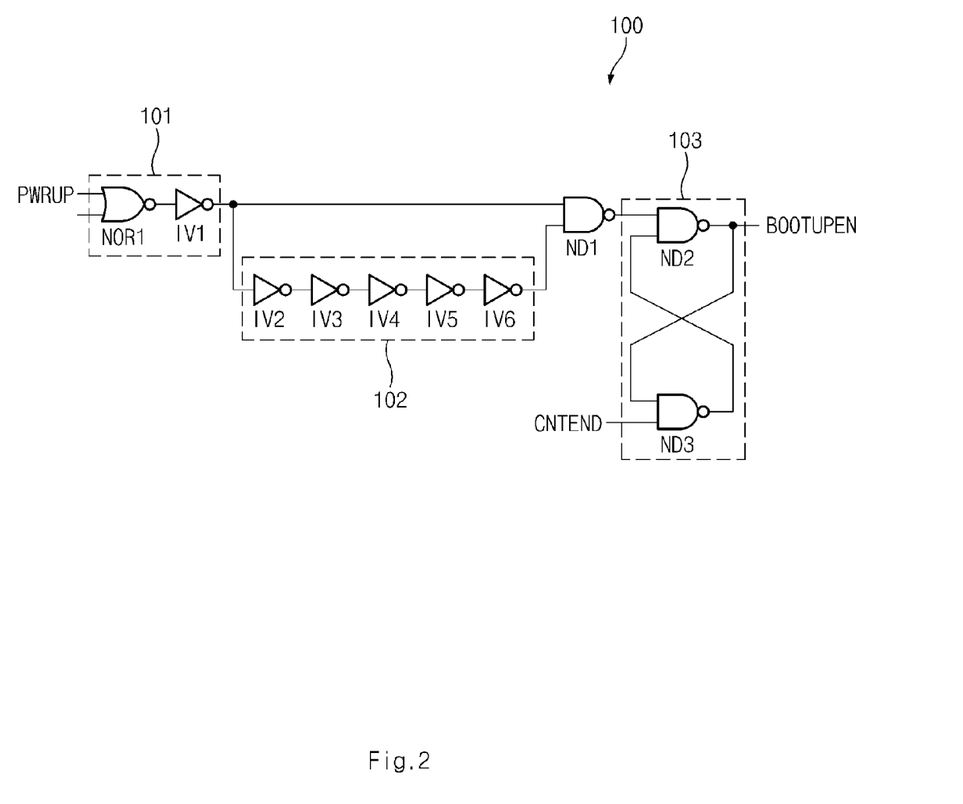
FIG. 2 is a detailed circuit diagram illustrating a boot-up controller shown in FIG. 1.

Referring to FIG. 2, a detailed circuit diagram illustrating the boot-up controller 100 shown in FIG. 1 is illustrated.

The boot-up controller 100 includes an input unit 101, a delay unit 102, and a latch unit 103.

In this case, the input unit 101 logically combines the power-up signal PWRUP and the boot-up command signal TMREBUP, and outputs the logical combination result. The input unit 101 may perform an OR operation between the power-up signal PWRUP and the boot-up command signal TMREBUP. If at least one of the power-up signal PWRUP and the boot-up command signal TMREBUP is activated, the input unit 101 outputs a high-level signal accordingly.

The input unit 101 includes a NOR gate NOR1 and an inverter IV1. The NOR gate NOR1 may perform the NOR operation between the power-up signal PWRUP and the boot-up command signal TMREBUP. The inverter IV1 may invert the output signal of the NOR gate NOR1.

The delay unit 102 delays the output signal of the input unit 101 by a predetermined time, and outputs the delayed signal. The delay unit 102 may include a plurality of inverters IV2~IV6 electrically coupled in series between an output terminal of the input unit 101 and an input terminal of the NAND gate ND1. The inverters IV2~IV6 may invert and delay the output signal of the input unit 101.

The latch unit 103 includes a plurality of NAND gates ND1~ND3. In this instance, the NAND gate ND1 may perform the NAND operation between the output signal of the input unit 101 and the output signal of the delay unit 102. The NAND gate ND2 may perform the NAND operation between output signals so that the NAND gate ND2 outputs the boot-up enable signal BOOTUPEN. The NAND gate ND3 may perform the NAND operation between the boot-up enable signal BOOTUPEN and the count-end signal CNTEND.

Figure 3:
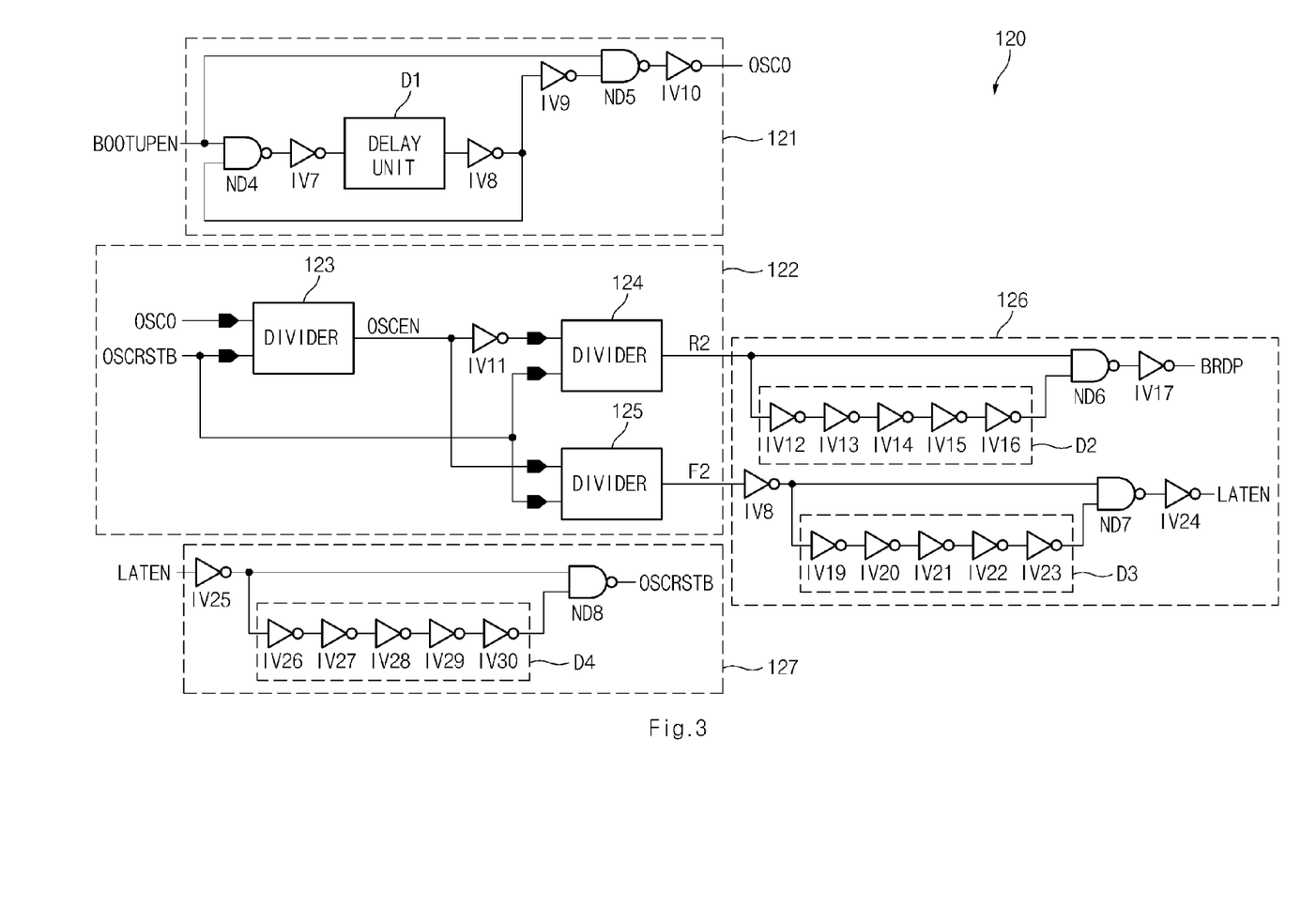
FIG. 3 is a detailed circuit diagram illustrating an oscillator shown in FIG. 1.

Referring to FIG. 3, a detailed circuit diagram illustrating the oscillator 120 shown in FIG. 1 is illustrated.

The oscillator 120 includes an input unit 121, a divider 122, an output unit 126, and a reset-signal generator 127.

The input unit 121 includes a plurality of NAND gates (ND4, ND5), a plurality of inverters (IV7~IV10), and a delay unit D1. The NAND gate ND4 may perform the NAND operation between the output signal of the inverter IV8 and the boot-up enable signal BOOTUPEN. The inverter IV7 may invert the output signal of the NAND gate ND4. The delay unit D1 may output the output signal of the inverter IV7. The inverters (IV8, IV9) may delay the output signal of the delay unit D1 without inverting. The NAND gate ND5 may perform the NAND operation between the boot-up enable signal BOOTUPEN and the output signal of the inverter IV9. The inverter IV10 inverts the output signal of the NAND gate ND5 and outputs an oscillation signal OSC0.

The divider 122 includes a plurality of dividers (123~125) and an inverter IV11. In this case, the divider 123 outputs an oscillation enable signal OSCEN by dividing the oscillation signal OSC0, and is reset by a reset signal OSCRSTB. The divider 124 outputs a division signal R2 by dividing the oscillation enable signal OSCEN inverted by the inverter IV11, and is reset by the reset signal OSCRSTB. Further, the divider 125 outputs a division signal F2 by dividing the oscillation enable signal OSCEN and is reset by the reset signal OSCRSTB.

The output unit 126 includes a plurality of inverters (IV17, IV18, IV24), a plurality of delay units (D2, D3), and a plurality of NAND gates (ND6, ND7). In this instance, the delay unit D2 includes an odd number of inverter chains (IV12~IV16) so that the delay unit D2 inverts and delays the division signal R2. The NAND gate ND6 may perform the NAND operation between the division signal R2 and the output signal of the delay unit D2. The inverter IV17 inverts the output signal of the NAND gate ND6 and outputs a boot-up read signal BRDP. The inverter IV8 may invert the division signal F2. In this situation, the delay unit D3 includes an odd number of inverter chains (IV19~IV23) so that the delay unit D3 inverts and delays the output signal of the inverter IV18.

Further, the NAND gate ND7 may perform the NAND operation between the output signal of the inverter IV18 and the output signal of the delay unit D3. The inverter IV24 inverts the output signal of the NAND gate ND7 and outputs a latch enable signal LATEN.

The reset-signal generator 127 includes an inverter IV25, a delay unit D4, and a NAND gate ND8. In this case, the inverter IV25 includes an odd number of inverter chains IV26~IV30 and inverts the output signal of the inverter IV25. The NAND gate ND8 performs the NAND operation between the output signal of the inverter IV25 and the output signal of the delay unit D4 and thus outputs a reset signal OSCRSTB.

Figure 4:
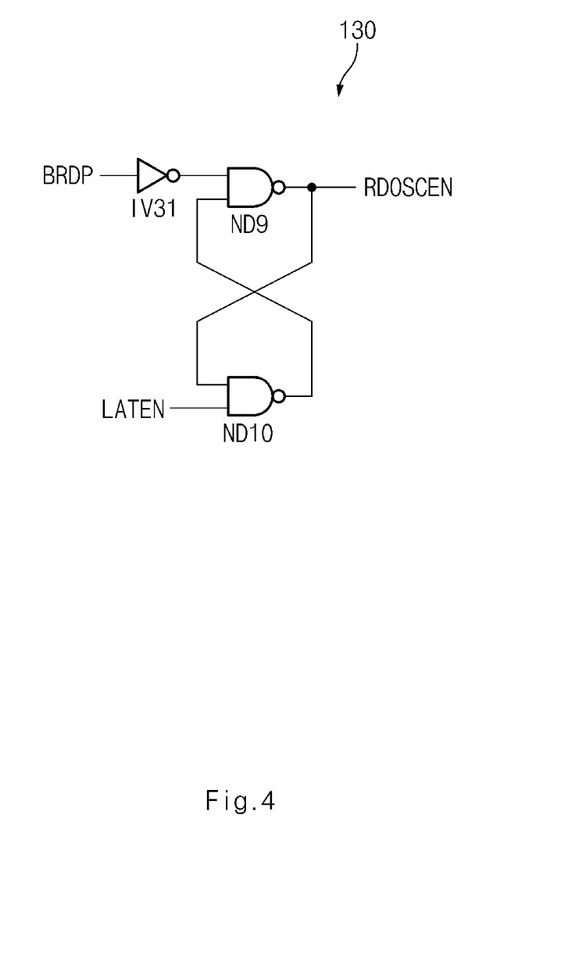
FIG. 4 is a detailed circuit diagram illustrating a read-period generator shown in FIG. 1.

Referring to FIG. 4, a detailed circuit diagram illustrating the read-period generator 130 shown in FIG. 1 is illustrated.

The read-period generator 130 includes an inverter IV31 and a plurality of NAND gates (ND9, ND10). In this case, the NAND gate ND9 performs the NAND operation between the boot-up read signal BRDP inverted by the inverter IV31 and the output signal of the NAND gate ND10, and thus outputs a read-period signal RDOSCEN. The NAND gate ND10 performs the NAND operation between the read-period signal RDOSCEN and the latch enable signal LATEN and outputs the NAND operation result to the NAND gate ND9.

Figure 5:
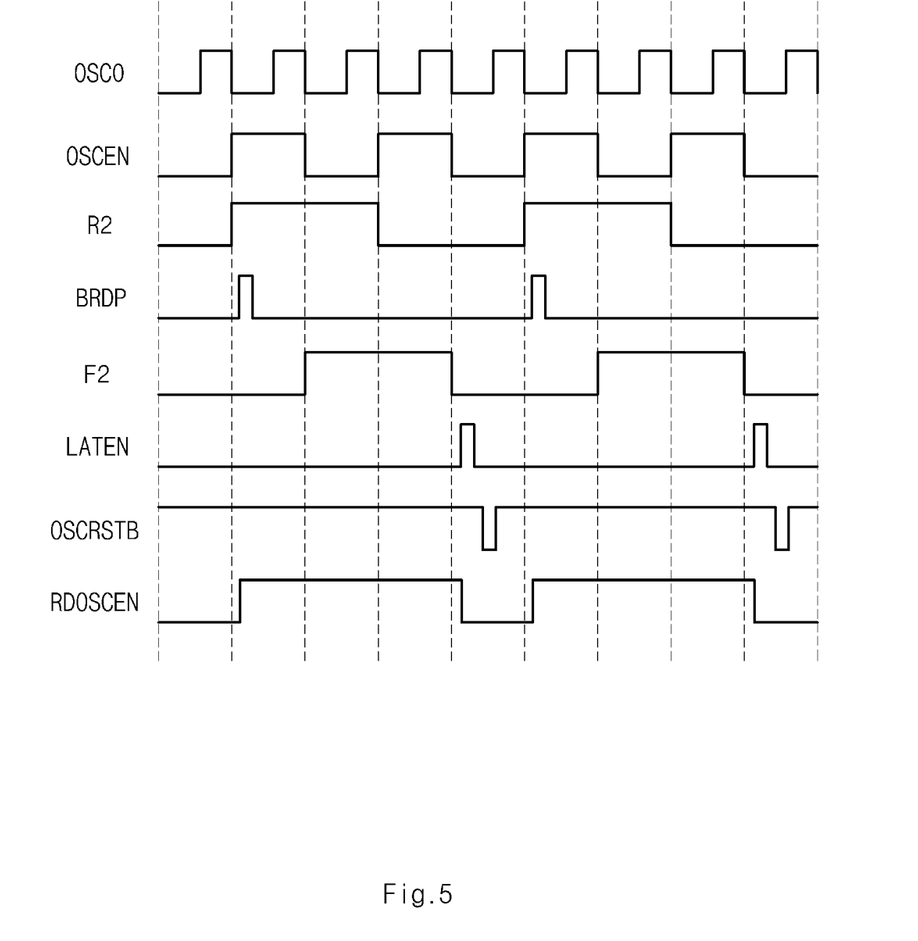
FIG. 5 is a timing diagram illustrating operations of the oscillator shown in FIG. 3 and the read-period generator shown in FIG. 4.

Referring to FIG. 5, a timing diagram illustrating operations of the oscillator 120 shown in FIG. 3 and the read-period generator 130 shown in FIG. 4 is illustrated.

If the boot-up enable signal BOOTUPEN is activated, the input unit 121 may output an oscillator signal OSC0 having a predetermined oscillation period. The divider 123 divides the oscillation signal OSC0 and outputs an oscillation enable signal OSCEN. In addition, the divider 124 may perform re-division of the oscillation enable signal OSCEN to output the division signal R2.

Thereafter, after lapse of the delay time of the delay unit D2, a pulse of the boot-up read signal BRDP is activated to a high level. The divider 125 divides the oscillation enable signal OSCEN and outputs the division signal F2.

Subsequently, after lapse of the delay time of the delay unit D3, a pulse of the latch enable signal LATEN is activated to a high level. The read-period generator 130 latches the boot-up read signal BRDP and outputs the read-period signal RDOSCEN of a high level. If the latch enable signal LATEN is activated to a high level or if the reset signal OSCRSTB is activated to a low level, the read-period signal RDOSCEN transitions to a low level.

Figure 6:
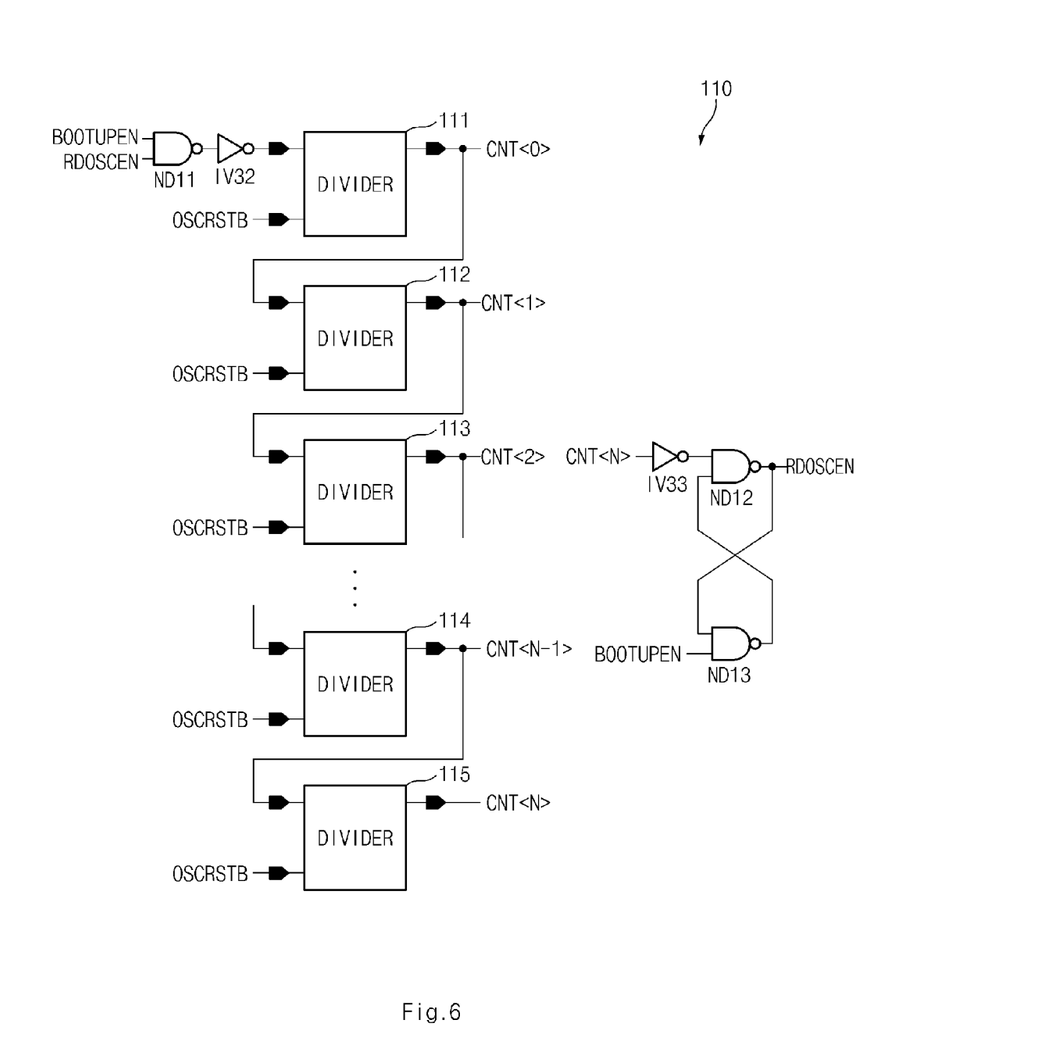
FIG. 6 is a detailed circuit diagram illustrating a counter unit shown in FIG. 1.

Referring to FIG. 6, a detailed circuit diagram illustrating the counter unit 110 shown in FIG. 1 is illustrated.

The counter unit 110 includes a plurality of NAND gates (ND11~ND13), a plurality of inverters (IV32, IV33), and a plurality of dividers (111~115).

In this instance, the NAND gate ND11 may perform the NAND operation between the boot-up enable signal BOOTUPEN and the read-period signal RDOSCEN. The inverter IV32 may invert the output signal of the NAND gate ND11.

The divider 111 outputs the counting signal CNT<0> by dividing the output signal of the inverter IV32, and is reset by the reset signal OSCRSTB. The divider 112 outputs the counting signal CNT<1> by dividing the counting signal CNT<0>, and is reset by the reset signal OSCRSTB. The divider 113 outputs the counting signal CNT<2> by dividing the counting signal CNT<1>, and is reset by the reset signal OSCRSTB. The divider 114 outputs the counting signal CNT<N−1> by dividing the counting signal CNT<2>, and is reset by the reset signal OSCRSTB. In addition, the divider 115 outputs the counting signal CNT<N> by dividing the counting signal CNT<N−1>, and is reset by the reset signal OSCRSTB.

The NAND gate ND12 performs the NAND operation between the counting signal CNT<N> inverted by the inverter IV33 and the output signal of the NAND gate ND13, and outputs the count-end signal CNTEND. The NAND gate ND13 performs the NAND operation between the boot-up enable signal BOOTUPEN and the count-end signal CNTEND, and outputs the NAND operation result to the NAND gate ND12.

Figure 7:
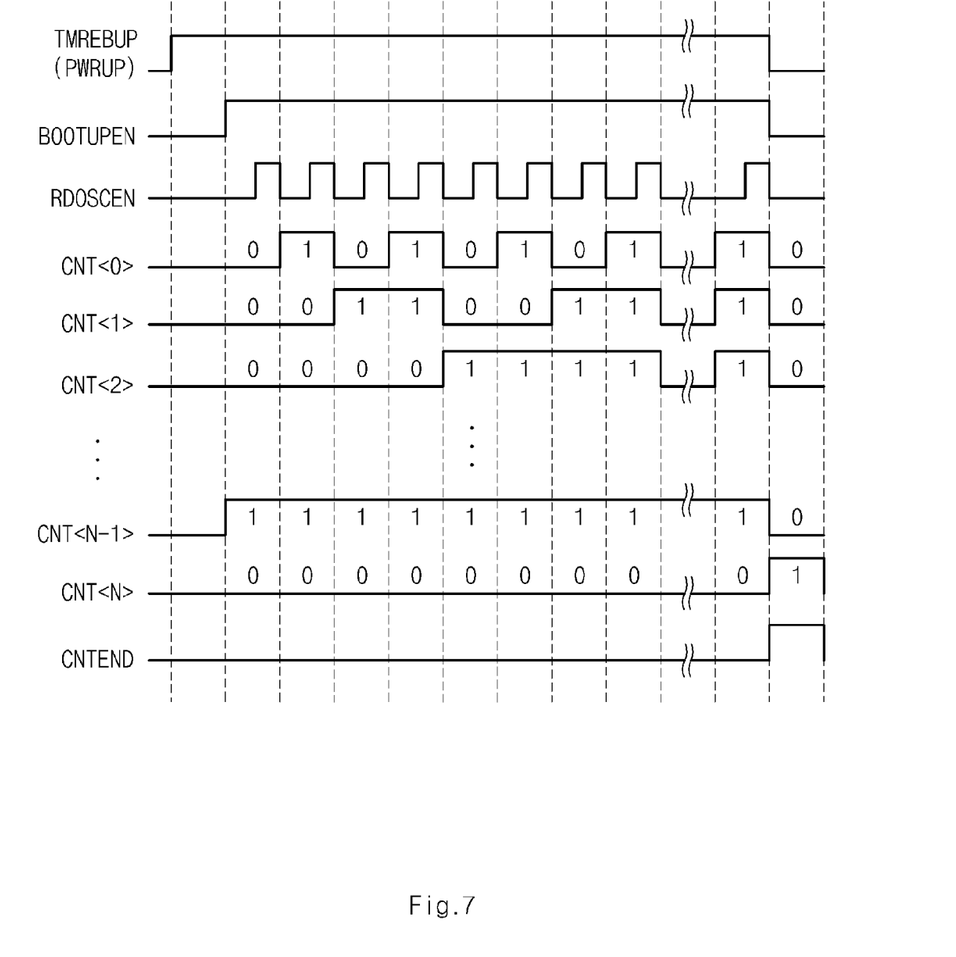
FIG. 7 is a timing diagram illustrating the counter unit shown in FIG. 6.

Referring to FIG. 7, a timing diagram illustrating the counter unit 110 shown in FIG. 6 is illustrated.

If the power-up signal PWRUP or the boot-up command signal TMREBUP is activated to a high level, the boot-up controller 100 outputs the boot-up enable signal BOOTUPEN of a high level after lapse of the delay time of the delay unit 102.

If the boot-up enable signal BOOTUPEN and the read-period signal RDOSCEN are activated to a high level, the counter unit 110 divides the input signals through the dividers (111~115) and outputs the counting signals CNT<0~N>. If the count-end signal CNTEND is activated, the counter unit 110 terminates the counting operation.

In this situation, if the boot-up enable signal BOOTUPEN transitions to a high level, defective-cell address information stored in the ARE 160 is read through the row decoder 150 and the column decoder 170. While the boot-up enable signal BOOTUPEN transitions to a high level, the read operation of the ARE 160 is continued. Since the ARE 160 is used in a DRAM, there is a need to read fuse information before the actual internal memory operation is performed during activation of the boot-up enable signal BOOTUPEN.

Figure 8:
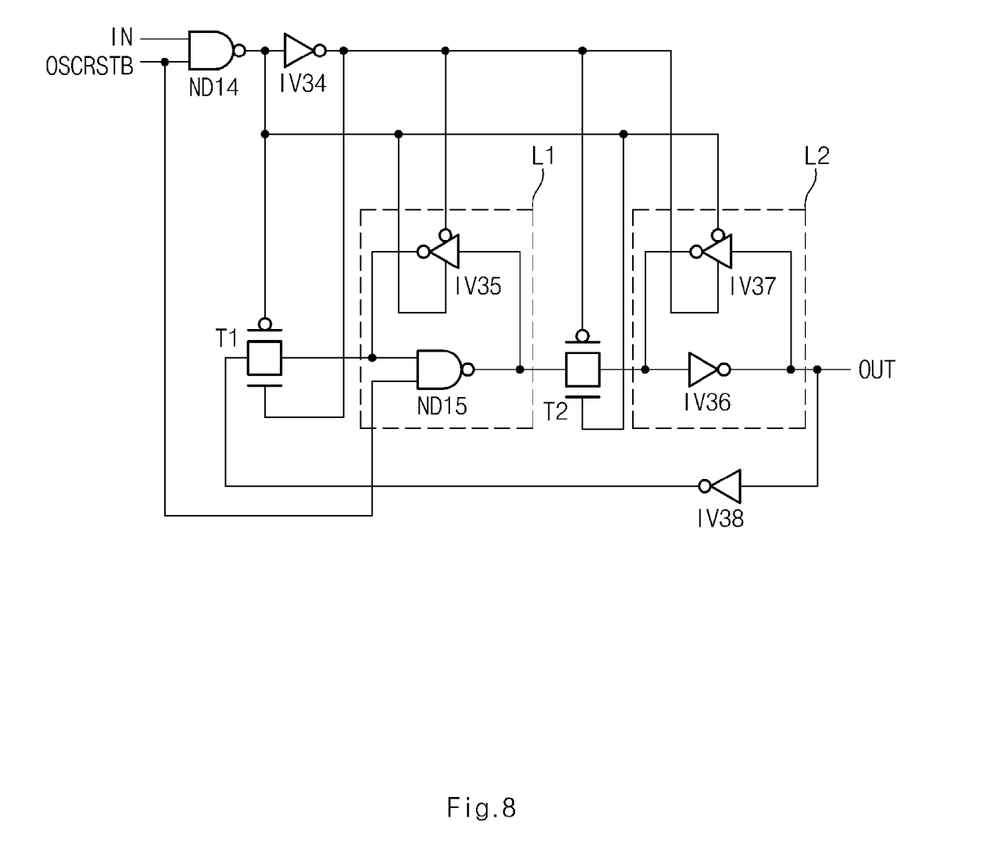
FIG. 8 is a detailed circuit diagram illustrating a divider shown in FIGS. 3 and 6.

Referring to FIG. 8, a detailed circuit diagram illustrating the dividers (123~125, 111~115) shown in FIGS. 3 and 6 is illustrated.

The divider includes a plurality of NAND gates (ND14, ND15), a plurality of transfer gates (T1, T2), and a plurality of inverters (IV34~IV38). In this case, the transfer gate T1 may selectively output the output signal of the inverter IV38 to a latch unit L1 in response to the output signal of the NAND gate ND14 and the output signal of the inverter IV34. The latch unit L1 including the inverter IV35 and the NAND gate ND15 latches the output signal of the transfer gate T1 and is reset by the reset signal OSCRSTB.

The transfer gate T1 may selectively output the output signal of the latch unit L1 in response to the output signal of the NAND gate ND14 and the output signal of the inverter IV34. The latch unit L2 including a plurality of inverters (IV36, IV37) latches the output signal of the transfer gate T2, and outputs an output signal OUT.

Figure 9:
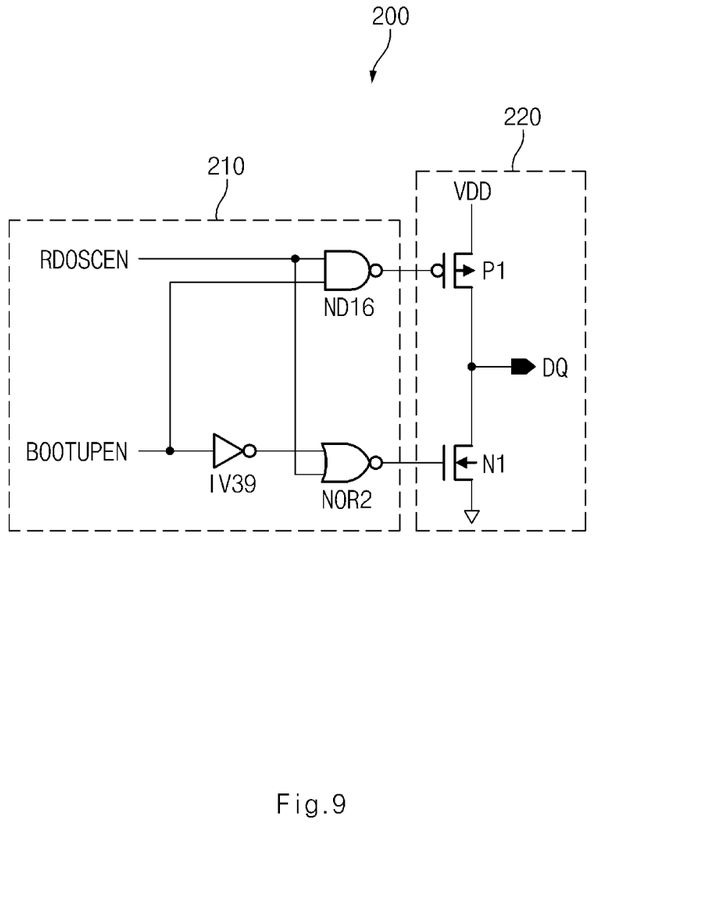
FIG. 9 is a detailed circuit diagram illustrating a monitoring unit shown in FIG. 1.

Referring to FIG. 9, a detailed circuit diagram illustrating the monitoring unit 200 shown in FIG. 1 is illustrated.

The monitoring unit 200 includes a combination unit 210 and an output driver 220.

The combination unit 210 may include a NAND gate ND16, an inverter IV39, and a NOR gate NOR2. The NAND gate ND16 may perform the NAND operation between the boot-up enable signal BOOTUPEN and the read-period signal RDOSCEN. The NOR gate NOR2 may perform the NOR operation between the boot-up enable signal BOOTUPEN inverted by the inverter IV39 and the read-period signal RDOSCEN.

The output driver 220 may include a PMOS transistor P1 acting as a pull-up drive element and an NMOS transistor N1 acting as a pull-down drive element. The PMOS transistor P1 and the NMOS transistor N1 are electrically coupled in series between a power-supply voltage (VDD) input terminal and a ground terminal so that a common drain terminal is electrically coupled to the output terminal DQ. A gate terminal of the PMOS transistor P1 is electrically coupled to an output terminal of the NAND gate ND16, and a gate terminal of the NMOS transistor N1 is electrically coupled to an output terminal of the NOR gate NOR2.

Figure 10:
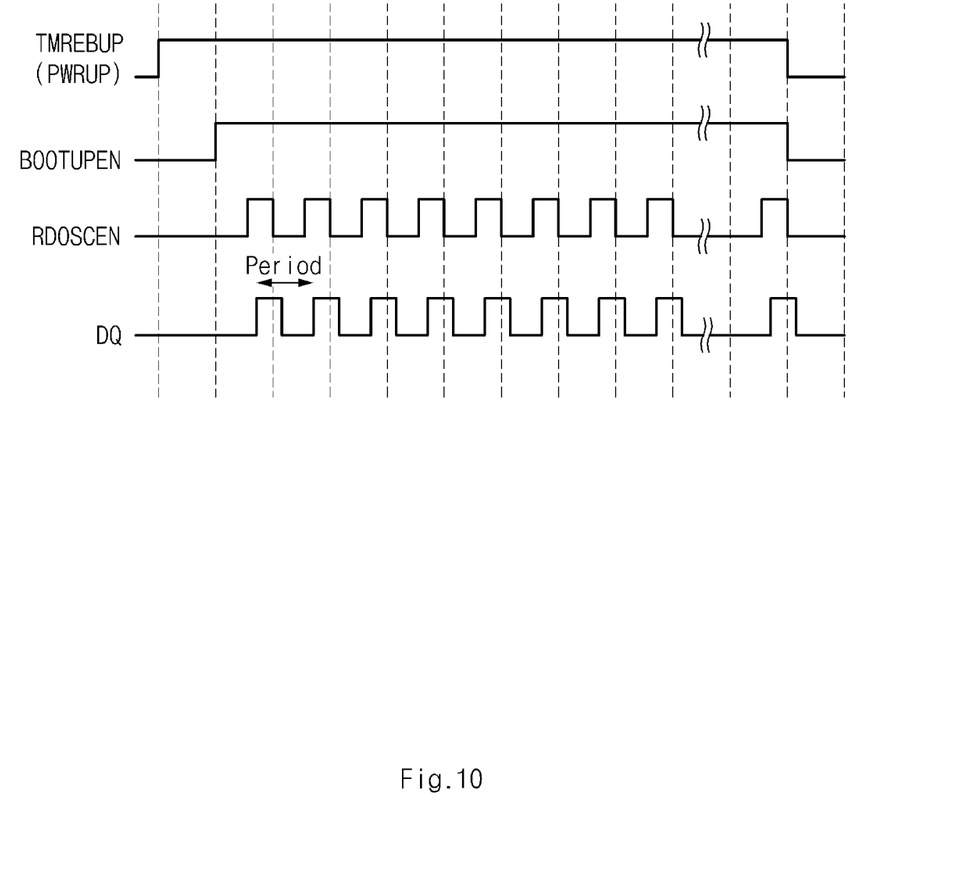
FIG. 10 is a timing diagram illustrating operations of the monitoring unit shown in FIG. 9.

Referring to FIG. 10, a timing diagram illustrating operations of the monitoring unit 200 shown in FIG. 9 is illustrated.

If the power-up signal PWRUP or the boot-up command signal TMREBUP is activated to a high level, the boot-up controller 100 outputs the boot-up enable signal BOOTUPEN of a high level after lapse of the delay time of the delay unit 102.

If the boot-up enable signal BOOTUPEN and the read-period signal RDOSCEN are at a high level, a pull-up drive signal is activated by combination of the combination unit 210. Accordingly, the NMOS transistor N1 is turned off and the PMOS transistor P1 is turned on, so that a high-level signal is output through the output terminal DQ.

On the other hand, if the read-period signal RDOSCEN is at a low level on the condition that the boot-up enable signal BOOTUPEN is at a high level, a pull-down drive signal is activated by combination of the combination unit 210. Accordingly, the PMOS transistor P1 is turned off and the NMOS transistor N1 is turned on so that a low-level signal is output through the output terminal DQ.

Figure 11:
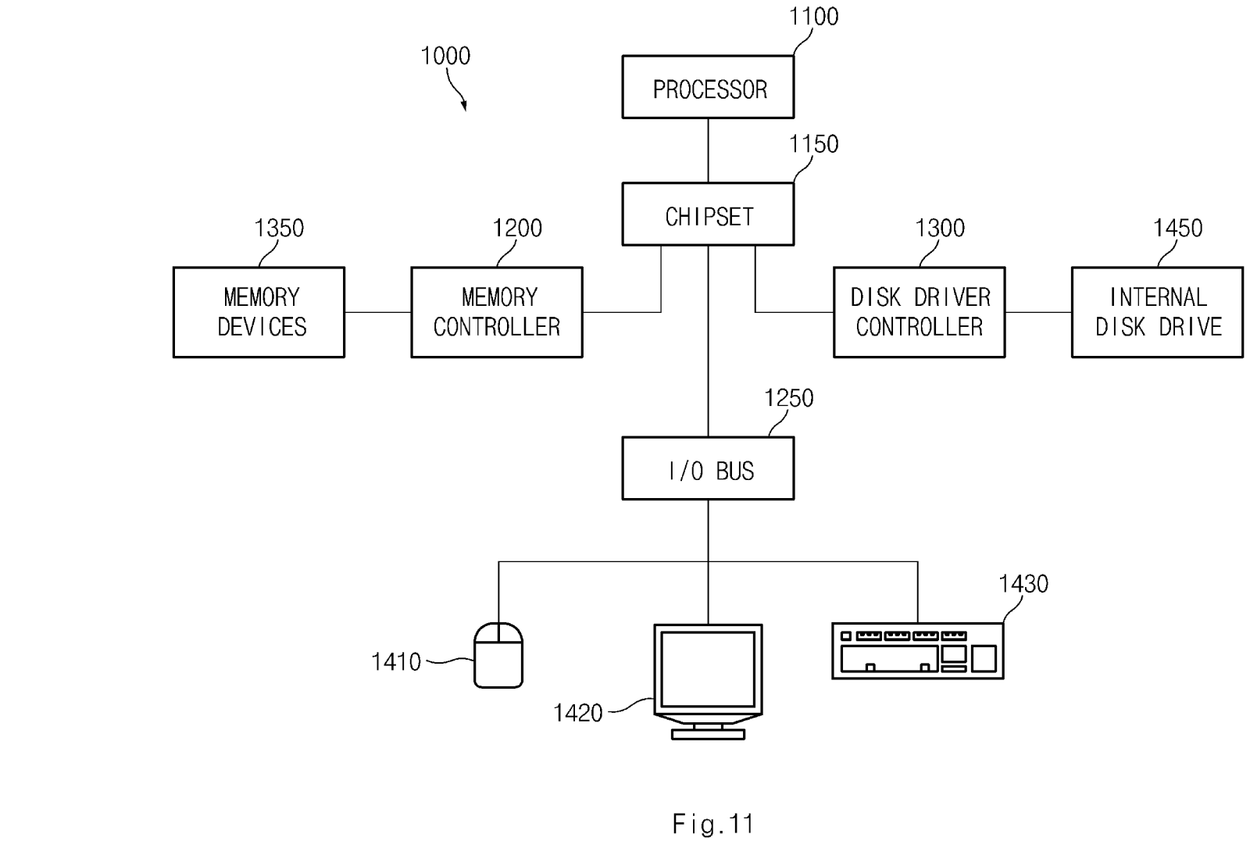
FIG. 11 illustrates a block diagram of a system employing a memory controller circuit in accordance with an embodiment of the invention.

Referring to FIG. 11, a system 1000 may include one or more processors 1100. The processor 1100 may be used individually or in combination with other processors. A chipset 1150 may be operably electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably electrically coupled to the chipset 1150. The memory controller 1200 can receive a request provided from the processor 1100 through the chipset 1150. The memory controller 1200 may be operably electrically coupled to one or more memory devices 1350. The memory device 1350 may include the monitoring circuit described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be operably electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

As is apparent from the above description, the monitoring circuit according to various embodiments can monitor the read period of the semiconductor device configured to use an array E-fuse (ARE) at a remote site to easily analyze a defect or failure of the semiconductor device.

Those skilled in the art will appreciate that the invention may be carried out in other specific ways than those set forth herein without departing from the spirit and essential characteristics of the invention. The above embodiments are to be construed in all aspects as illustrative and not restrictive. The scope of the invention should be determined by the appended claims and their legal equivalents, not by the above description. Further, all changes coming within the meaning and equivalency range of the appended claims are intended to be embraced therein. In addition, it is obvious to those skilled in the art that claims that are not explicitly cited in each other in the appended claims may be presented in combination as an embodiment of the invention or included as a new claim by a subsequent amendment after the application is filed.

Although a number of illustrative embodiments consistent with the invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A monitoring circuit of a semiconductor device comprising:
    a boot-up controller configured to generate a boot-up enable signal in response to a power-up signal and a boot-up command signal;
    a read-period generator configured to output a read-period signal in response to a boot-up read signal; and
    a monitoring unit configured to output the read-period signal to an external output terminal during activation of the boot-up enable signal to allow the read-period signal to be monitored.

2. The monitoring circuit according to claim 1, wherein the monitoring unit includes:
    a combination unit configured to logically combine the boot-up enable signal and the read-period signal; and
    an output driver configured to output a high-level signal or a low-level signal to the output terminal in response to an output signal of the combination unit.

3. The monitoring circuit according to claim 2, wherein the combination unit activates a pull-up drive signal when the boot-up enable signal and the read-period signal are at a high level, and a pull-down drive signal when the boot-up enable signal is at a high level and the read-period signal is at a low level.

4. The monitoring circuit according to claim 2, wherein the combination unit includes:
    a NAND gate configured to perform a NAND operation between the boot-up enable signal and the read-period signal; and
    a NOR gate configured to perform a NOR operation between the boot-up enable signal and an inversion signal of the read-period signal.

5. The monitoring circuit according to claim 2, wherein the output driver outputs a high-level signal to the output terminal when a pull-up drive signal received from the combination unit is activated, and a low-level signal to the output terminal when a pull-down drive signal received from the combination unit is activated.

6. The monitoring circuit according to claim 2, wherein the output driver includes:
    a pull-up drive element electrically coupled between a power-supply voltage terminal and the output terminal to receive a pull-up drive signal from the combination unit through a gate terminal; and
    a pull-down drive element electrically coupled between the output terminal and a ground terminal to receive a pull-down drive signal from the combination unit through a gate terminal.

7. The monitoring circuit according to claim 1, wherein the monitoring unit outputs a high-level signal to the output terminal when the boot-up enable signal and the read-period signal are at a high level, and a low-level signal to the output terminal when the boot-up enable signal is at a high level and the read-period signal is at a low level.

8. The monitoring circuit according to claim 1, wherein the boot-up enable signal is activated to a high level when at least one of the power-up signal and the boot-up command signal is activated.

9. The monitoring circuit according to claim 1, wherein the boot-up controller is reset in response to a count-end signal.

10. A monitoring circuit of a semiconductor device comprising:
    a boot-up controller configured to generate a boot-up enable signal in response to a power-up signal and a boot-up command signal;
    a read-period generator configured to output a read-period signal in response to a boot-up read signal and a latch enable signal;
    a counter unit configured to output a counting signal by counting the number of read-period signals during an activation of the boot-up enable signal, and output a count-end signal upon completion of the counting operation;
    a fuse array configured to output repair information in response to the counting signal; and
    a monitoring unit configured to output the read-period signal to an external output terminal during activation of the boot-up enable signal to allow the read-period signal to be monitored.

11. The monitoring circuit according to claim 10, wherein the monitoring unit includes:
    a combination unit configured to logically combine the boot-up enable signal and the read-period signal; and
    an output driver configured to output a high-level signal or a low-level signal to the output terminal in response to an output signal of the combination unit.

12. The monitoring circuit according to claim 11, wherein the combination unit activates a pull-up drive signal when the boot-up enable signal and the read-period signal are at a high level, and a pull-down drive signal when the boot-up enable signal is at a high level and the read-period signal is at a low level.

13. The monitoring circuit according to claim 11, wherein the combination unit includes:
    a NAND gate configured to perform a NAND operation between the boot-up enable signal and the read-period signal; and
    a NOR gate configured to perform a NOR operation between the boot-up enable signal and an inversion signal of the read-period signal.

14. The monitoring circuit according to claim 11, wherein the output driver outputs a high-level signal to the output terminal when a pull-up drive signal received from the combination unit is activated, and a low-level signal to the output terminal when a pull-down drive signal received from the combination unit is activated.

15. The monitoring circuit according to claim 11, wherein the output driver includes:
    a pull-up drive element electrically coupled between a power-supply voltage terminal and the output terminal so as to receive a pull-up drive signal from the combination unit through a gate terminal thereof; and
    a pull-down drive element electrically coupled between the output terminal and a ground terminal so as to receive a pull-down drive signal from the combination unit through a gate terminal thereof.

16. The monitoring circuit according to claim 10, wherein the monitoring unit outputs a high-level signal to the output terminal when the boot-up enable signal and the read-period signal are at a high level, and a low-level signal to the output terminal when the boot-up enable signal is at a high level and the read-period signal is at a low level.

17. The monitoring circuit according to claim 10, wherein the boot-up enable signal is activated to a high level when at least one of the power-up signal and the boot-up command signal is activated.

18. The monitoring circuit according to claim 10, wherein the boot-up controller is reset in response to the count-end signal.

19. The monitoring circuit according to claim 10, further comprising:
- an oscillator configured to output the boot-up read signal and the latch enable signal in response to the boot-up enable signal;
- a delay unit configured to delay the latch enable signal;
- a row decoder configured to select a word line of the fuse array in response to the counting signal;
- a column decoder configured to select a bit line of the fuse array in response to the counting signal;
- a sensing unit configured to sense data read from the fuse array through the column decoder in response to an output signal of the delay unit; and
- a latch unit configured to latch an output signal of the sensing unit.

20. The monitoring circuit according to claim 10, wherein the fuse array includes an array E-fuse (ARE).

* * * * *